United States Patent [19]
Yoshitake et al.

[11] Patent Number: 5,628,807
[45] Date of Patent: May 13, 1997

[54] METHOD FOR FORMING A GLASS PRODUCT FOR A CATHODE RAY TUBE

[75] Inventors: Masaru Yoshitake; Eiji Yanagisawa; Naoki Yoshida; Masuo Sugisaki; Atsuyoshi Takenaka, all of Yokohama; Yutaka Segawa, Funabashi; Toshihiro Ohashi, Funabashi; Hiroshi Wakatsuki, Funabashi, all of Japan

[73] Assignee: Asahi Glass Company Ltd., Tokyo, Japan

[21] Appl. No.: 510,660

[22] Filed: Aug. 3, 1995

[30] Foreign Application Priority Data

Aug. 15, 1994 [JP] Japan ................................. 6-191477
Oct. 27, 1994 [JP] Japan ................................. 6-264124
Jan. 13, 1995 [JP] Japan ................................. 7-004411

[51] Int. Cl.$^6$ ...................................... C03B 40/00
[52] U.S. Cl. ............................................. 65/26
[58] Field of Search .................... 65/24, 26, 374.12

[56] References Cited

U.S. PATENT DOCUMENTS

| | | | |
|---|---|---|---|
| H480 | 6/1988 | Welch | 65/287 |
| 3,536,466 | 10/1970 | Kurokawa et al. | 65/181 |
| 3,586,493 | 6/1971 | Claassen | 65/291 |
| 3,915,870 | 10/1975 | Brown | 252/30 |
| 3,994,707 | 11/1976 | Newing, Jr. et al. | 65/26 |
| 4,806,139 | 2/1989 | Cartier et al. | 65/170 |
| 5,069,046 | 12/1991 | Moulding | 65/106 |
| 5,171,348 | 12/1992 | Umetani et al. | 65/374.11 |
| 5,306,339 | 4/1994 | Takeda et al. | 106/38.27 |

*Primary Examiner*—Peter Chin
*Assistant Examiner*—Sean Vincent
*Attorney, Agent, or Firm*—Oblon, Spivak, McClelland, Maier & Neustadt, P.C.

[57] ABSTRACT

A glass forming mold which comprises a substrate made of stainless steel and a coating comprising the following components formed as the outermost surface coating on the substrate: (1) from 40 to 94 wt % of nickel and/or cobalt as component A; (2) from 5 to 59 wt % of tungsten as component B; and (3) from 0.5 to 40 wt % of at least one transition element having a melting point of at least 2,200° C. as component C.

4 Claims, No Drawings

METHOD FOR FORMING A GLASS PRODUCT FOR A CATHODE RAY TUBE

BACKGROUND OF THE INVENTION

1. Field of the Invention

The present invention relates to a glass forming mold, particularly to a glass forming mold to be used for press forming a glass product such as a front glass panel or a funnel for a cathode ray tube for television, and a method for forming the glass product for a cathode ray tube.

2. Discussion of Background

A cathode ray tube for television is prepared by producing a front panel (image-forming region), a funnel and a neck portion separately, coating fluorescent substances on the inner surface of the panel, attaching a shadow mask and electrode, followed by assembling them. Especially, extremely severe quality control is required for the preparation of a front panel on which electrical beams are focused and images are formed.

Forming of the panel is carried out by pressing molten glass at a high temperature of about 1,000° C. with a plunger against a forming mold, and the mold is required to have such properties as high mechanical strength, heat resistance and chemical stability against high temperature glass.

As a forming mold for such a purpose, a stainless steel alloy having chromium plating or nickel-tungsten alloy plating applied thereon, has been heretofore employed. The plated coating deteriorates during use, and it is necessary to strip the deteriorated coating and plate the substrate afresh for reuse. Chromium plating suitable for the mold may be applied by several kinds of bath such as Sargent bath, but in each case, the bath contains highly toxic hexavalent chromium ion. Further, the chromium plating has drawbacks such that the glass surface tends to have scuffs during the molding, it is necessary to apply a releasing agent frequently, and it is extremely weak against halogen.

On the other hand, nickel alloy plating is excellent in the releasing property, and an alloy plating whereby hardness is secured by incorporating tungsten, such as nickel-tungsten, cobalt-tungsten, nickel-phosphorus-tungsten or nickel-boron-tungsten, has been developed.

For example, nickel-tungsten alloy plating has advantages such that a coating can be formed under a condition which is free from toxicity or bad odor of reagents, the frequency for using a releasing agent can be reduced, and scuffs are scarcely formed on the glass surface. Accordingly, it is reported that this plating has been increasingly employed in recent years.

However, tungsten contained in the nickel-tungsten alloy coating is susceptible to oxidation, and the coating is rapidly oxidized. Accordingly, such a nickel-tungsten coating has a drawback that when used as a surface coating for a mold for forming a panel, its useful life is very short as compared with that of the chromium plating.

In a first aspect, the present invention provides a glass forming mold which comprises a substrate made of stainless steel and a coating comprising the following components formed as the outermost surface coating on the substrate:

(1) from 40 to 94 wt % of nickel and/or cobalt as component A;

(2) from 5 to 59 wt % of tungsten as component B; and (3) from 0.5 to 40 wt % of at least one transition element having a melting point of at least 2,200° C. as component C.

The mold of the present invention has oxidation resistance much higher than the conventional mold. Accordingly, it is thereby possible to obtain a very long useful life, and the mold is also excellent in the releasing property as a characteristic of a nickel alloy coating, whereby scuffs tend to scarcely be formed on the glass surface.

To secure the characteristics of a nickel alloy or a cobalt alloy, component A is incorporated in an amount of from 40 to 94 wt % in the coating. Further, the amount of component B is required to be from 5 to 59 wt % to secure the strength of the coating. Component C serves to impart oxidation resistance to the alloy coating and to secure the strength of the coating, and its concentration is from 0.5 to 40 wt %. When the concentrations of the respective components are within the above ranges, the coating has a releasing property specific to nickel, a low defective product rate and oxidation resistance equal or superior to chromium, whereby the mold will have a very long useful life.

In the first aspect of the present invention, component C is preferably at least one element selected from the group consisting of tantalum, niobium, molybdenum, rhenium, ruthenium and iridium. Such element serves to impart oxidation, resistance to the coating and at the same time, serves to secure the strength of the coating.

In the first aspect of the present invention, the coating preferably contains from 0.5 to 20 wt % of phosphorus and/or boron as component D. Component D serves to impart oxidation resistance to the coating and at the same time serves to secure the strength of the coating and to form a fine crystal grain layer and an amorphous layer in the coating.

In the first aspect of the present invention, the thickness of the outermost surface coating is preferably from 1 to 500 µm. If it is thinner than 1 µm, the coating tends to be susceptible to high temperature oxidation or mechanical deformation. If it is thicker than 500 µm, it takes time to form the coating, and such is beyond effective ranges from the technical and economical viewpoint.

In the first aspect of the present invention, the outermost surface coating preferably contains a fine crystal grain layer having an average grain size of at most 20 nm, or an amorphous layer. The present inventors have conducted an extensive study for improving the oxidation resistance of an alloy plating of nickel-tungsten type. As a result, it has been found that by using a stainless steel as the substrate and making the microstructure of the outermost surface coating to be very fine crystal grains close to an amorphous structure with non-developed crystal boundaries even at a high temperature during the molten glass forming, it is possible to bring the degree of diffusion of metal elements which occurs through the crystal grain boundaries to be substantially at most 0.1%, based on the entire coating. Accordingly, it is possible to provide a nickel or cobalt alloy coating, whereby diffusion of metal elements is suppressed.

Thus, it is possible to prevent iron atoms as constituting elements of the substrate from being supplied to the surface of the coating rapidly and in a large amount through the crystal grain boundaries of the coating. Further, it has been found that as compared with a conventional coating made of a polycrystal wherein the proportion of the crystals grain boundaries is substantial, it is readily possible to form a chemically and mechanically stable oxide film at the surface of the coating, whereby the progress of oxidation in the thickness direction of the coating is prevented, and the useful life of the mold can be improved to a large extent.

The very fine crystal grains in the present invention cannot generally be defined, since the proportion of grain boundaries in the entire volume of crystals and the nature of grain boundaries such as diffusibility of elements vary depending upon the substances constituting the coating, the method for preparing the coating, heat treatment, etc. However, it is at least necessary that the average crystal grain size is at most 20 nm as obtained by such a means as measurement of the half value width of X-ray diffraction peaks as observed from the direction perpendicular to the surface of the coating or inspection of the electron diffraction, and the crystalline form is such that the nickel or cobalt alloy coating is composed of crystal grains other than columnar crystal grains. The above range for the crystal grain size is preferably maintained also during the glass forming.

If the crystal grain size exceeds 20 nm, the proportion of the grain boundaries in the entire crystals becomes substantial, whereby the diffusion of metal elements through the grain boundaries, which is very fast as compared with the diffusion through the crystal grains, will be substantial. Further, in a coating containing a large quantity of columnar crystals, diffusion routes for metal elements tend to be short, such being undesirable.

The main elements constituting the coating are nickel and/or cobalt capable of forming an oxide layer relatively stable against high temperature use. Further, the element to be alloyed therewith is preferably at least one element selected from the group consisting of tungsten, tantalum, niobium, molybdenum, rhenium, ruthenium and iridium, so that effects for prevention of high temperature oxidation, prevention of crystal grain growth and maintenance of high temperature strength can be obtained even during the glass forming. Further, it is preferred to incorporate phosphorus and/or boron to make the crystal grains fine or amorphous-like to obtain a microstructure with non-developed crystal grains, and to prevent crystal growth of the coating even during the glass forming.

In the first aspect of the present invention, it is preferred to provide an interliner comprising as the main component at least one element selected from the group consisting of elements of Groups 8, 9, 10 and 11, between the stainless steel substrate and the outermost surface coating. By providing such an interliner, bonding of the stainless steel substrate and the outermost surface coating can be enhanced, and preparation of the alloy coating of the outermost surface can readily be carried out. For example, nickel cobalt, iron, palladium, copper or the like is formed by a thin film-forming method such as a plating method, a Chemical Vapor Deposition (CVD) method, a Physical Vapor Deposition (PVD) method or a metal spraying method. A plating method is particularly preferred from the viewpoint of the film-forming speed, smoothness and low costs. Such an element is preferably contained in an amount of from 40 to 100 wt % as the main component, with a view to utilizing the characteristics of such an element.

The thickness of the interliner is preferably from 0.1 to 50 μm. If the thickness is less than 0.1 μm, it tends to be difficult to effectively cover the entire surface, and if it exceeds 50 μm, the residual strain tends to increase, whereby the significance as an interliner will be lost.

The interliner preferably contains a fine crystal grain layer having an average grain size of at most 20 nm, or an amorphous layer. In the same manner as in the case of the outermost surface coating, it is thereby possible to further reduce the degree of diffusion of metal elements, which takes place through the crystal grain boundaries, based on the entire coating.

The thickness of the fine crystal grain layer or the amorphous layer in the interliner is preferably at least 0.05 μm. If it is thinner than 0.05 μm, the effects for preventing the diffusion tends to be low.

In the first aspect of the present invention, the mold substrate is preferably made of a martensite type stainless steel from the viewpoint of the mechanical strength, corrosion resistance, thermal conductivity, thermal expansion property, etc.

In a second aspect, the present invention provides a method for producing a glass forming mold, which comprises forming a coating comprising the following components as the outermost surface layer on a substrate made of stainless steel by a method selected from the group consisting of a plating method, a CVD method, a PVD method and a metal spraying method:

(1) from 40 to 94 wt % of nickel and/or cobalt as component A;

(2) from 5 to 59 wt % of tungsten as component B; and (3) from 0.5 to 40 wt % of at least one transition element having a melting point of at least 2,200° C. as component C.

Particularly preferred is a plating method, since the thin film-forming speed is thereby high, a smooth surface along the mold substrate can readily be obtained, and the cost is relatively low.

In a third aspect, the present invention provides a method for forming a glass product for a cathode ray tube, which comprises forming a glass product for a cathode ray tube which contains silicon oxide, sodium oxide, potassium oxide, strontium oxide and barium oxide, by means of a glass forming mold which comprises a substrate made of stainless steel and a coating comprising the following components formed as the outermost surface coating on the substrate:

(1) from 40 to 94 wt % of nickel and/or cobalt as component A;

(2) from 5 to 59 wt % of tungsten as component B; and (3) from 0.5 to 40 wt % of at least one transition element having a melting point of at least 2,200° C. as component C.

In this case, when the above-mentioned glass product for a cathode ray tube is formed by means of the glass forming mold, it is possible to obtain a glass product for a cathode ray tube, such as a front panel or a funnel which is excellent in the releasing property and which has good surface properties such as the surface precision and the surface roughness.

In a fourth aspect, the present invention provides a method for forming a glass product for a cathode ray tube, which comprises forming a glass product for a cathode ray tube which contains silicon oxide, sodium oxide, potassium oxide, strontium oxide and barium oxide, by means of a glass forming mold which comprises a substrate made of stainless steel and a coating comprising the following components formed as the outermost surface coating on the substrate:

(1) from 40 to 94 wt % of nickel and/or cobalt as component A;

(2) from 5 to 59 wt % of tungsten as component B;

(3) from 0.5 to 40 wt % of at least one transition element having a melting point of at least 2,200° C. as component C, and (4) from 0.5 to 20 wt % of phosphorus and/or boron as component D.

In this case, in the same manner as the third aspect of the present invention, it is possible to obtain a glass product for a cathode ray tube, such as a front panel or a funnel which is excellent in the releasing property and which has good surface properties such as surface precision and surface roughness.

In a fifth aspect, the present invention provides a method for forming a glass product for a cathode ray tube, which comprises forming a glass product for a cathode ray tube which contains silicon oxide, sodium oxide, potassium oxide and lead oxide, by means of a glass forming mold which comprises a substrate made of stainless steel and a coating comprising the following components formed as the outermost surface coating on the substrate:

(1) from 40 to 94 wt % of nickel and/or cobalt as component A;

(2) from 5 to 59 wt % of tungsten as component B; and (3) from 0.5 to 40 wt % of at least one transition element having a melting point of at least 2,200° C. as component C.

Also in this case, it is possible to obtain a glass product for a cathode ray tube such as a front panel or a funnel which is excellent in the releasing property and which has good surface properties such as surface precision and surface roughness. Particularly, the glass product contains lead oxide, whereby it is particularly suitable as a glass product for sealing radiation such as X-rays and thus is suitable for a funnel glass for a cathode ray tube.

In a sixth aspect, the present invention provides a method for forming a glass product for a cathode ray tube, which comprises forming a glass product for a cathode ray tube which contains silicon oxide, sodium oxide, potassium oxide and lead oxide, by means of a glass forming mold which comprises a substrate made of stainless steel and a coating comprising the following components formed as the outermost surface coating on the substrate:

(1) from 40 to 94 wt % of nickel and/or cobalt as component A;

(2) from 5 to 59 wt % of tungsten as component B;

(3) from 0.5 to 40 wt % of at least one transition element having a melting point of at least 2,200° C. as component C, and (4) from 0.5 to 20 wt % of phosphorus and/or boron as component D.

Also in this case, it is possible to obtain a glass product for a cathode ray tube, such as a front panel or a funnel which is excellent in the releasing property and which has good surface properties such as surface precision and surface roughness.

Deterioration of the mold is believed to be attributable to oxidation and mechanical deformation of the surface coating due to molding of the glass at a high temperature of about 1,000° C. Namely, this oxidation process comprises corrosion due to air before and after contact with the glass, i.e. so-called high temperature oxidation and a mechanochemical reaction with the molten glass as a molten salt during the process for forming the front panel.

To control the deterioration, it is important to secure stability of the outermost surface coating, and conventional chromium plating provides extremely dense chromium oxide to provide heat resistance. If the protection of the outermost oxide layer is weak, oxygen in air will diffuse and penetrate through the oxide layer into the interior of the metal coating, whereby deterioration will progress. Further, the glass melting temperature exceeds a so-called Tammann temperature i.e. a temperature at which movement of metal atoms in the metal lattice becomes active, whereby iron contained in the stainless steel of the metal substrate tends to diffuse to the surface, and deterioration will thereby further progress.

The mechanism for improvement of the oxidation resistance or the mechanical strength obtained by the addition of at least one element selected from the group consisting of tantalum, niobium, molybdenum, rhenium, ruthenium and iridium to the nickel-tungsten alloy or cobalt-tungsten alloy in the coating of the present invention, is not clearly understood. However, it is considered to be such that by the addition of such an element, a dense oxide layer may more readily be formed, movement of elements in the coating may be suppressed, and the mechanical properties or the thermal conductivity may become more suitable to the mold.

The mechanism for improvement of the oxidation resistance and the mechanical strength due to the fine crystal grain layer or the amorphous layer in the outermost surface coating is believed to be such that the boundary diffusion of iron atoms is thereby suppressed, and the diffusion is limited mainly to the diffusion in the crystal grains which is extremely slow as compared with the grain boundary diffusion, whereby a stable oxide layer may more readily be formed on the outermost surface, and the mechanical properties and the thermal conductivity may become more suitable to the glass forming mold.

Now, the present invention will be described in further detail with reference to Examples. However, it should be understood that the present invention is by no means restricted to such specific Examples.

EXAMPLE 1

Using a nickel chloride bath, a nickel layer was formed in a thickness of 5 μm on the surface of a martensite type SUS 420J2 (JIS G4303) substrate. Then, using a plating solution comprising nickel sulfate, sodium tungstate, sodium molybdate and sodium citrate as the main components, an outermost surface coating of nickel-tungsten-molybdenum (weight ratio of 70:21:9) was formed in a thickness of 20 μm.

EXAMPLE 2

Using a nickel chloride bath, a nickel layer was formed in a thickness of 7 μm on the surface of a SUS 420J2 substrate. Then, using a plating solution comprising nickel sulfate, sodium tungstate, cobalt sulfate, sodium molybdate and sodium citrate as the main components, an outermost surface coating of nickel-tungsten-molybdenum-cobalt (weight ratio of 50:30:15:5) was formed in a thickness of 15 μm.

EXAMPLE 3

Using a cobalt chloride bath, a cobalt layer was formed in a thickness of 6 μm on the surface of a SUS 420J2 substrate. Then, using a plating solution comprising nickel sulfate, sodium tungstate, sodium molybdate, and sodium citrate as the main components, an outermost surface coating of nickel-tungsten-molybdenum (weight ratio of 68:27:5) was formed in a thickness of 15 μm.

EXAMPLE 4

Using a tetraaminopalladium bromide bath, a palladium layer was formed in a thickness of 4 μm on the surface of a SUS 420J2 substrate. Then, using a plating solution comprising nickel sulfate, sodium tungstate, sodium molybdate and sodium citrate as the main components, an outermost surface coating of nickel-tungsten-molybdenum (weight ratio of 70:25:5) was formed in a thickness of 16 μm.

EXAMPLE 5

Using a nickel chloride bath, a nickel layer was formed in a thickness of 3 μm on the surface of a SUS 420J2 substrate.

Then, using an ammonium alkaline electroless plating bath containing palladium chloride and hypophosphorous acid as a reducing agent, a nickel-palladium layer was formed thereon. Then, using a plating solution comprising nickel sulfate, sodium tungstate, sodium molybdate, and sodium citrate as the main components, an outermost surface coating of nickel-tungsten-molybdenum (weight ratio of 70:26:4) was formed in a thickness of 13 µm.

EXAMPLE 6

Using a nickel chloride bath, a nickel layer was formed in a thickness of 3 µm on the surface of a SUS 420J2 substrate. Then, using an ammonium alkaline electroless plating bath containing palladium chloride, having nickel sulfate added thereto and using hypophosphorous acid as a reducing agent, a nickel-palladium-phosphorus layel was formed thereon. Then, using a plating solution comprising nickel sulfate, sodium tungstate, sodium molybdate and sodium citrate as the main components, an outermost surface coating of nickel-tungsten-molybdenum (weight ratio of 70:26:4) was formed in a thickness of 17 µm.

EXAMPLE 7

Using a nickel chloride bath, a nickel layer was formed in a thickness of 4 µm on the surface of a SUS 420J2 substrate. Then, using a plating solution comprising nickel sulfate, sodium tungstate, sodium molybdate, sodium citrate, sodium hypophosphite and phosphoric acid as the main components, an outermost surface coating of nickel-tungsten-molybdenum-phosphorus (weight ratio of 69:20:6:5) was formed in a thickness of 22 µm.

EXAMPLE 8

Using a nickel chloride bath, a nickel layer was formed in a thickness of 6 µm on the surface of a SUS 420J2 substrate. Then, using a plating solution comprising nickel sulfate, sodium tungstate, cobalt sulfate, sodium molybdate, sodium citrate, phosphorous acid, phosphoric acid and boric acid as the main components, an outermost surface coating of nickel-tungsten-molybdenum-cobalt-phosphorus-boron (weight ratio of 54:33:7:4:1:1) was formed in a thickness of 16 µm.

EXAMPLE 9

Using a cobalt chloride bath, a cobalt layer was formed in a thickness of 5 µm on the surface of a SUS 420J2 substrate. Then, using a plating solution comprising nickel sulfate, sodium tungstate, sodium molybdate, sodium citrate and boric acid as the main components, an outermost surface coating of nickel-tungsten-molybdenum-boron (weight ratio of 68:25:5:2) was formed in a thickness of 17 µm.

EXAMPLE 10

Using a nickel chloride bath, a nickel layer was formed in a thickness of 2 µm on the surface of the glass forming side of a mold substrate made of SUS 420J2. Then, using a plating solution comprising nickel sulfate, sodium tungstate, sodium molybdate, sodium citrate, sodium hypophosphite and phosphoric acid as the main components, an outermost surface alloy coating (thickness: 20 µm, average grain size of crystals: 6 nm) of nickel-tungsten-molybdenum-phosphorus (weight ratio of 60:25:9:6) was formed.

EXAMPLE 11

Using a cobalt sulfate bath, a cobalt layer was formed in a thickness of 3 µm on the surface of the glass forming side of a mold substrate made of SUS 420J2. Then, using a plating solution comprising cobalt sulfate, sodium tungstate, sodium molybdate, potassium citrate, boric acid and dimethylamine borane as the main components, an outermost surface alloy coating (thickness: 18 µm, average grain size of crystals: 15 nm) of cobalt-tungsten-molybdenum-boron (weight ratio of 53:37:8:2) was formed.

EXAMPLE 12

Using a nickel chloride bath, a nickel layer was formed in a thickness of 4 µm on the surface of a SUS 420J2 substrate. Then, using an ammonium alkaline electroless plating bath containing palladium chloride and hypophosphorous acid as a reducing agent, a nickel-palladium layer was formed thereon. Then, using a plating solution comprising nickel sulfate, sodium tungstate, sodium molybdate, sodium citrate and sodium hypophosphite as the main components, an outermost surface coating of nickel-tungsten-molybdenum-phosphorus (weight ratio of 65:24:6:5) was formed in a thickness of 15 µm.

EXAMPLE 13

Using a nickel chloride bath, a nickel layer was formed in a thickness of 4 µm on the surface of a SUS 420J2 substrate. Then, using an ammonium alkaline electroless plating bath containing palladium chloride, having nickel sulfate added thereto and using hypophosphorous acid as a reducing agent, a nickel-palladium-phosphorus layer was formed thereon. Then, using a plating solution comprising nickel sulfate, sodium tungstate, sodium molybdate, sodium citrate, phosphoric acid and boric acid as the main components, an outermost surface coating of nickel-tungsten-molybdenum-phosphorus-boron (weight ratio of 66:23:7:3:1) was formed in a thickness of 18 µm.

EXAMPLE 14

By means of a sputtering apparatus having three targets of nickel, tungsten and tantalum, a nickel interliner was formed in a thickness of 1 µm on the glass forming side surface of a SUS 420J2 substrate, and then an outermost surface coating of nickel-tungsten-tantalum (weight ratio of 68:26:6) was formed in a thickness of 5 µm by a sputtering method as in the above Examples.

EXAMPLE 15

By a metal spraying method using fine powders of nickel, tungsten and niobium as starting materials, a nickel interliner was formed in a thickness of 10 µm on the glass forming side surface of a SUS 420J2 substrate, and then an outermost surface coating of nickel-tungsten-niobium (weight ratio of 72:25:3) was formed in a thickness of 30 µm by a metal spraying method.

EXAMPLE 16

Using a cobalt chloride bath, an interliner was formed in a thickness of 2.5 µm on the glass forming side surface of a SUS 420J2 substrate, and then using a plating solution comprising nickel sulfate, sodium tungstate, iridium chloride and sodium citrate, and an outermost surface coating of nickel-tungsten-iridium (weight ratio of 72:24:4) was formed in a thickness of 14 µm.

EXAMPLE 17

Using a nickel chloride bath, a nickel interliner was formed in a thickness of 3 µm on the glass forming side surface of a SUS 420J2 substrate, and then, using a plating solution comprising nickel sulfate, sodium tungstate, ruthenium chloride and citric acid, an outermost surface coating of nickel-tungsten-ruthenium (weight ratio of 72:25:3) was formed in a thickness of 12 μm.

EXAMPLE 18

Using a nickel chloride bath, a nickel interliner was formed in a thickness of 3.5 μm on the glass forming side surface of a SUS 420J2 substrate, and then using a plating solution comprising nickel sulfate, sodium tungstate, potassium perrhenate and potassium citrate, an outermost surface coating of nickel-tungsten-rhenium (weight ratio of 70:22:8) was formed in a thickness of 16 μm.

COMPARATIVE EXAMPLE 1

Using a chromium sulfate bath, an outermost surface coating was formed in a thickness of 16 μm on the surface of a SUS 420J2 substrate.

COMPARATIVE EXAMPLE 2

Using a nickel chloride bath, a nickel layer was formed in a thickness of 6 μm on the surface of a SUS 420J2 substrate. Then, using a plating solution comprising nickel sulfate, sodium tungstate and potassium citrate as the main components, an outermost surface coating of nickel-tungsten (weight ratio of 71:29) was formed in a thickness of 20 μm.

COMPARATIVE EXAMPLE 3

Using a nickel chloride bath, a nickel layer composed of fine columnar crystals (average grain size: 0.1 μm) wherein the crystal grain boundaries were orientated to be perpendicular to the outermost surface, was formed in a thickness of 6 μm on the surface of the glass forming side of a mold substrate made of SUS 420J2. Then, using a plating solution comprising nickel sulfate, sodium tungstate and potassium citrate as the main components, an outermost surface alloy coating, made of polycrystals (average grain size: 50 nm) of nickel-tungsten (weight ratio of nickel:tungsten=72:28) wherein crystal grain boundaries were abundantly present, was formed in a thickness of 20 μm.

EVALUATION

With respect to each of the coatings of Examples 1 to 18 and Comparative Examples 1 to 3, the Vickers hardness, the Taber abrasion index and the weight increase by oxidation in air were measured, and front panels of a cathode ray tube were formed by using mold (plungers) provided with these coatings. The results are shown in Table 1. The composition of the glass for the front panel of a cathode ray tube employed, is shown in Table 2. In Table 1, the Taber abrasion index, the oxidation weight increase and the panel forming properties (scuffs on the glass surface, the useful life of the mold) were represented by relative values to the respective values of Comparative Example 1 being 10.

TABLE 1

| | Vickers hardness | Taber abrasion index | Oxidation weight increase | Glass employed | Scuffs on the glass surface | Useful life of the mold |
|---|---|---|---|---|---|---|
| Examples | | | | | | |
| 1 | 630 | 37 | 13 | A | 0 | 15 |
| 2 | 650 | 30 | 8 | A | 0 | 16 |
| 3 | 665 | 32 | 15 | A | 0 | 15 |
| 4 | 645 | 31 | 14 | B | 0 | 15 |
| 5 | 648 | 30 | 13 | B | 0 | 15 |
| 6 | 648 | 30 | 12 | B | 0 | 15 |
| 7 | 650 | 35 | 12 | A | 0 | 17 |
| 8 | 672 | 28 | 7 | A | 0 | 18 |
| 9 | 687 | 30 | 14 | A | 0 | 17 |
| 10 | 710 | 35 | 12 | A | 0 | 19 |
| 11 | 680 | 39 | 17 | B | 0 | 17 |
| 12 | 661 | 28 | 12 | B | 0 | 17 |
| 13 | 668 | 29 | 11 | B | 0 | 18 |
| 14 | 670 | 30 | 14 | A | 0 | 15 |
| 15 | 665 | 32 | 16 | B | 0 | 16 |
| 16 | 650 | 34 | 17 | A | 0 | 15 |
| 17 | 640 | 36 | 16 | B | 0 | 14 |
| 18 | 630 | 38 | 18 | B | 0 | 13 |
| Comparative Examples | | | | | | |
| 1 | 639 | 10 | 10 | A | 10 | 10 |
| 2 | 517 | 70 | 33 | A | 0 | 4 |
| 3 | 517 | 70 | 33 | A | 0 | 4 |

TABLE 2

| Glass | $SiO_2$ | $Na_2O$ | $K_2O$ | SrO | BaO | ZrO, etc. |
|---|---|---|---|---|---|---|
| A | 62.0 | 7.5 | 8.1 | 11.6 | 2.2 | 8.6 |

| Glass | $SiO_2$ | $Na_2O$ | $K_2O$ | PbO | SrO, etc. | Unit, wt % |
|---|---|---|---|---|---|---|
| B | 64.6 | 6.0 | 2.5 | 3.0 | 23.9 | |

As shown by the Examples, the present invention provides advantages such that the coating is superior in the releasing property to the conventional chromium coating, and scuffs are less likely to form on the glass surface, and it is far superior in the oxidation resistance to a nickel tungsten coating.

What is claimed is:

1. A method for forming a glass product for a cathode ray tube which contains silicon oxide, sodium oxide, potassium oxide and lead oxide, by means of a glass forming mold which comprises a substrate made of stainless steel and a coating comprising the following components A, B and C formed as the outermost surface coating on the substrate:

(1) from 40 to 94 wt % one nickel and/or cobalt as component A;

(2) from 5 to 59 wt % of tungsten as component B;

(3) from 0.5 to 40 wt % of at least one transition 5, element having a melting point of at least 2,200° C. as component C, and (4) from 0.1 to 20 wt % of phosphorus and/or boron as component D.

2. A method for forming a glass product for a cathode ray tube which contains silicon oxide, sodium oxide, potassium oxide, strontium oxide and barium oxide, by means of a glass forming mold which comprises a substrate made of stainless steel and a coating comprising the following components A, B and C formed as the outermost surface coating on the substrate:

(1) from 40 to 94 wt % of nickel and/or cobalt as component A;

(2) from 5 to 59 wt % of tungsten as component B; and (3) from 0.5 to 40 wt % of at least one transition element having a melting point of at least 2,200° C. as component C.

3. A method for forming a glass product for a cathode ray tube which contains silicon oxide, sodium oxide, potassium oxide, strontium oxide and barium oxide, by means of a glass forming mold which comprises a substrate made of stainless steel, and a coating comprising the following components A, B and C formed as the outermost surface coating on the substrate:

(1) from 40 to 94 wt % of nickel and/or cobalt as component A;

(2) from 5 to 59 wt % of tungsten as component B;

(3) from 0.5 to 40 wt % of at least one transition element having a melting point of at least 2,200° C. as component C, and (4) from 0.5 to 20 wt % of phosphorus and/or boron as component D.

4. A method for forming a glass product for a cathode ray tube which contains silicon oxide, sodium oxide, potassium oxide and lead oxide, by means of a glass forming mold which comprises a substrate made of stainless steel and a coating comprising the following components A, B and C formed as the outermost surface coating on the substrate:

(1) from 40 to 94 wt % of nickel and/or cobalt as component A;

(2) from 5 to 59 wt % of tungsten as component B; and (3) from 0.5 to 40 wt % of at least one transition element having a melting point of at least 2,200° C. as component C.

* * * * *